(12) United States Patent
Lu

(10) Patent No.: US 10,420,211 B2
(45) Date of Patent: Sep. 17, 2019

(54) SEMICONDUCTOR PACKAGE DEVICE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/673,235

(22) Filed: Aug. 9, 2017

(65) Prior Publication Data

US 2019/0053373 A1   Feb. 14, 2019

(51) Int. Cl.
*H01L 23/31* (2006.01)
*H01L 23/49* (2006.01)
*H05K 1/11* (2006.01)
*H01L 23/00* (2006.01)
*H01L 23/498* (2006.01)

(52) U.S. Cl.
CPC .......... *H05K 1/111* (2013.01); *H01L 23/3171* (2013.01); *H01L 23/49816* (2013.01); *H01L 24/03* (2013.01); *H01L 24/05* (2013.01); *H01L 24/11* (2013.01); *H01L 24/13* (2013.01); *H01L 24/16* (2013.01); *H01L 2224/02351* (2013.01); *H01L 2224/0391* (2013.01); *H01L 2224/05548* (2013.01); *H01L 2224/05567* (2013.01); *H01L 2224/13024* (2013.01); *H01L 2224/73204* (2013.01); *H01L 2924/18161* (2013.01)

(58) Field of Classification Search
CPC .......... H01L 23/3171; H01L 23/49816; H01L 24/03; H01L 24/05; H01L 24/11; H01L 24/13; H01L 24/16; H05K 1/111
See application file for complete search history.

(56) References Cited

U.S. PATENT DOCUMENTS

| | | | | |
|---|---|---|---|---|
| 5,482,897 A * | 1/1996 | Lynch | ................. | H01L 23/5286 257/E23.153 |
| 5,903,058 A * | 5/1999 | Akram | .................... | H01L 24/11 257/737 |
| 6,287,950 B1 * | 9/2001 | Wu | ........................ | H01L 24/03 257/E21.508 |
| 6,756,671 B2 * | 6/2004 | Lee | ..................... | H01L 23/3114 257/737 |
| 7,253,519 B2 * | 8/2007 | Huang | .............. | H01L 21/76838 257/734 |
| 7,468,545 B2 * | 12/2008 | Lin | ..................... | H01L 21/2885 257/622 |
| 7,566,650 B2 * | 7/2009 | Lin | ........................ | H01L 24/11 257/E21.506 |
| 7,709,954 B2 * | 5/2010 | Loo | ........................ | H01L 23/525 257/734 |

(Continued)

*Primary Examiner* — Ida M Soward
(74) *Attorney, Agent, or Firm* — Foley & Lardner LLP; Cliff Z. Liu

(57) ABSTRACT

A semiconductor package device includes a passivation layer, a conductive element, a redistribution layer (RDL) and an electronic component. The passivation layer has a first surface and second surface opposite to the first surface. The conductive element is within the passivation layer. The conductive element defines a recess facing the second surface of the passivation layer. The RDL is on the passivation layer and electrically connected with the conductive element. The electronic component is disposed on the RDL and electrically connected with the RDL.

21 Claims, 15 Drawing Sheets

(56) References Cited

U.S. PATENT DOCUMENTS

| | | | | |
|---|---|---|---|---|
| 8,138,602 B2* | 3/2012 | Daubenspeck | H01L 23/488 | 257/737 |
| 8,293,636 B2* | 10/2012 | Schulze | H01L 24/11 | 257/738 |
| 8,558,383 B2* | 10/2013 | Lin | H01L 21/2885 | 257/758 |
| 8,859,340 B2* | 10/2014 | Gregorich | H01L 23/49827 | 257/714 |
| 9,484,307 B2* | 11/2016 | Tsai | H01L 23/3114 | |
| 9,570,413 B2* | 2/2017 | Hu | H01L 24/13 | |
| 9,640,683 B2* | 5/2017 | Suen | H01L 31/02327 | |
| 2004/0112944 A1* | 6/2004 | Tong | H01L 24/11 | 228/215 |
| 2006/0125110 A1* | 6/2006 | Do | H01L 24/11 | 257/778 |
| 2007/0252275 A1* | 11/2007 | Huang | H01L 21/76838 | 257/737 |
| 2008/0230798 A1* | 9/2008 | Huang | H01L 21/0274 | 257/99 |
| 2008/0315433 A1* | 12/2008 | Chen | H01L 21/76898 | 257/777 |
| 2009/0072397 A1* | 3/2009 | Loo | H01L 24/02 | 257/738 |
| 2010/0096754 A1* | 4/2010 | Lee | H01L 21/568 | 257/738 |
| 2010/0187685 A1* | 7/2010 | Morifuji | H01L 23/3128 | 257/737 |
| 2010/0237506 A1* | 9/2010 | Brunnbauer | H01L 24/11 | 257/773 |
| 2010/0320577 A1* | 12/2010 | Pagaila | H01L 21/565 | 257/659 |
| 2011/0068435 A1* | 3/2011 | Hudson | H01L 23/562 | 257/620 |
| 2011/0215449 A1* | 9/2011 | Camacho | H01L 23/28 | 257/659 |
| 2012/0038064 A1* | 2/2012 | Camacho | H01L 24/29 | 257/777 |
| 2013/0295699 A1* | 11/2013 | Liu | H01L 22/14 | 438/17 |
| 2013/0307119 A1* | 11/2013 | Chen | H01L 23/49822 | 257/532 |
| 2015/0102503 A1* | 4/2015 | Lin | H01L 21/486 | 257/774 |
| 2015/0348877 A1* | 12/2015 | Huang | H01L 24/03 | 257/734 |
| 2015/0348916 A1* | 12/2015 | Chen | H01L 21/4803 | 257/669 |
| 2016/0035588 A1* | 2/2016 | Lin | H01L 21/4846 | 438/107 |
| 2017/0047281 A1* | 2/2017 | Hu | H01L 23/49866 | |
| 2017/0084556 A1* | 3/2017 | Chen | H01L 24/05 | |
| 2017/0110413 A1* | 4/2017 | Chen | H01L 21/3205 | |
| 2017/0186696 A1* | 6/2017 | Scanlan | H01L 23/544 | |
| 2017/0271203 A1* | 9/2017 | Liu | H01L 21/76825 | |
| 2017/0287845 A1* | 10/2017 | Huang | H01L 21/76802 | |
| 2017/0358534 A1* | 12/2017 | Kim | H01L 23/3114 | |
| 2017/0365572 A1* | 12/2017 | Lee | H01L 24/19 | |
| 2018/0102313 A1* | 4/2018 | Shih | H01L 23/49894 | |

\* cited by examiner

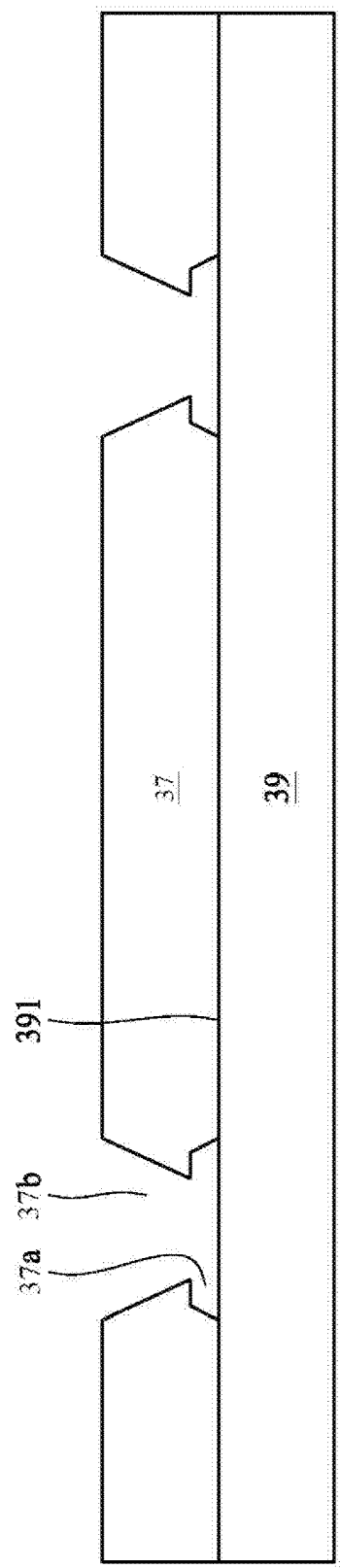

SEMICONDUCTOR PACKAGE DEVICE

BACKGROUND

1. Technical Field

The present disclosure relates generally to a semiconductor package device and a method of manufacturing the same. More particularly, the present disclosure relates to a semiconductor package device including a soldering pad structure and a method of manufacturing the same.

2. Description of the Related Art

A semiconductor package device may include solder balls that electrically connect an electronic component to a substrate. In a comparative semiconductor package device, solder balls may be directly bonded to flat solder pads. Those solder pads are referred to as "SMD" (solder mask defined) type solder pads. However, the connection between the solder ball and the solder pad typically cannot sustain a relatively greater lateral stress, which may result in delamination of the solder ball.

As an attempt to solve the above problem, a lateral surface of a solder pad can be exposed from the substrate and the solder ball is connected to both the lateral surface and a bottom surface of the solder pad. This type of solder pads is also referred to as "NSMD" (non-solder mask defined) type solder pads. However, due to non-uniform barrier layer on the lateral surface and the bottom surface of the solder pads (e.g., the barrier layer is relatively thin on the lateral surface and is relatively thick on the bottom surface), an uneven intermetallic compound (IMC) layer may be formed (e.g., the IMC layer is relatively thick on the lateral surface and is relatively thin on the bottom surface). The relatively thick portion of the IMC may tend to crack. In addition, false soldering may occur due to a gap formed between the lateral surface of the pad and a dielectric layer of the substrate and/or contamination in the gap.

SUMMARY

In one or more embodiments, a conductive structure comprises a passivation layer, a conductive element surrounded by the passivation layer, and a conductive contact adjacent to the conductive element. The conducting element has a first surface and a second surface adjacent to the first surface. An angle between the first surface and the second surface is greater than about 90 degrees. The conductive contact is adjacent to the conductive element and electrically connected with the first surface and the second surface of the conductive element.

In one or more embodiments, a conductive structure comprises a passivation layer and a conductive element. The passivation layer has a first surface and a second surface opposite to the first surface. The passivation layer defines a first opening tapered from the first surface of the passivation layer toward the second surface of the passivation layer. The conductive element is within the first opening. The conductive element defines a recess toward the second surface of the passivation layer.

In one or more embodiments, a semiconductor package device comprises a passivation layer, a conductive element, a redistribution layer (RDL) and an electronic component. The passivation layer has a first surface and a second surface opposite to the first surface. The conductive element is within the passivation layer. The conductive element defines a recess facing the second surface of the passivation layer. The RDL is on the passivation layer and electrically connected with the conductive element. The electronic component is disposed on the RDL and electrically connected with the RDL.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 3A illustrates one or more stages of a method of manufacturing a semiconductor package device in accordance with some embodiments of the present disclosure;

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
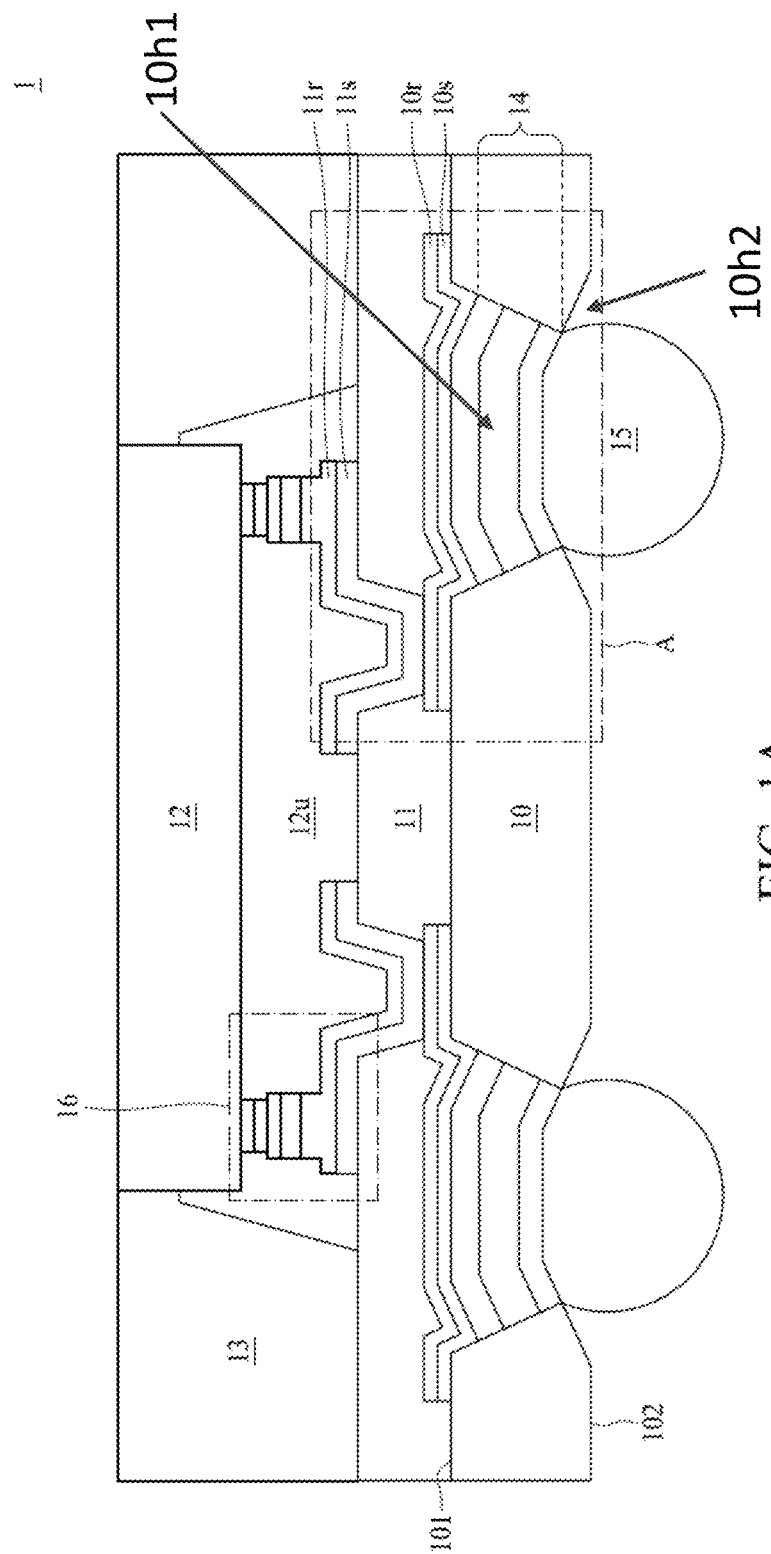
FIG. 1A illustrates a cross-sectional view of a semiconductor package device in accordance with some embodiments of the present disclosure.

FIG. 1A illustrates a cross-sectional view of a semiconductor package device 1 in accordance with some embodiments of the present disclosure. The semiconductor package device 1 includes a passivation layer 10, a dielectric layer 11, an electronic component 12, a package body 13, an interconnection structure 14 (also referred to as a conductive element) and an electrical contact 15.

The passivation layer 10 has a top surface 101 (also referred to as first surface) and a bottom surface 102 (also referred to as second surface) opposite to the top surface. In some embodiments, the passivation layer 10 includes silicon oxide, silicon nitride, gallium oxide, aluminum oxide, scandium oxide, zirconium oxide, lanthanum oxide, hafnium oxide, another oxide, another nitride, or a combination of two or more thereof. In some embodiments, the passivation layer 10 can be replaced by solder mask liquid (e.g., in an ink form) or film depending on specifications of various embodiments.

The passivation layer 10 defines a first opening (e.g., opening 10h1 filled by the interconnection structure 14) tapering from the top surface 101 toward the bottom surface 102 and a second opening (e.g., opening 10h2 in which the electrical contact 15 is disposed) tapering from the bottom surface 102 toward the top surface 101. The first opening and the second opening are connected to penetrate the passivation layer 10. The interconnection structure 14 is disposed within the first opening. For example, the interconnection 14 may be surrounded by the passivation layer 10.

Figure 1B:
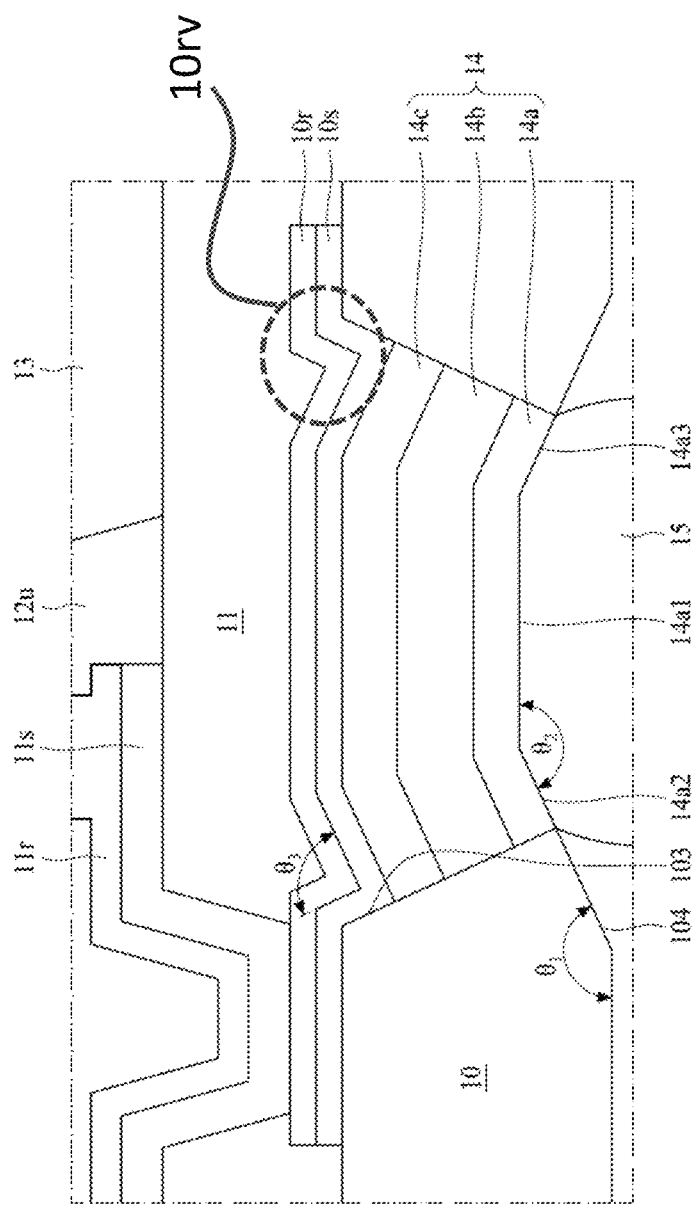
FIG. 1B illustrates an enlarged view of a portion of the semiconductor package device of FIG. 1A in accordance with some embodiments of the present disclosure.

In some embodiments, the interconnection structure 14 is disposed within the first opening and at least a portion of the second opening. As shown in FIG. 1B, which illustrates an enlarged view of a portion of the semiconductor package device 1 of FIG. 1A circled by a square A, in some embodiments, a slope of a sidewall 103 of the first opening is tilted at an angle that is different from a tilt angle of a slope of a sidewall 104 of the second opening. In some embodiments, an angle $\theta_1$ between the bottom surface 102 of the passivation layer 10 and the sidewall 104 of the second opening is in a range from about 160 degrees to about 180 degrees, from about 165 degrees to about 178 degrees, or from about 173 degrees to about 178 degrees. The interconnection structure 14 includes a first metal layer 14a, a barrier layer 14b and a second metal layer 14c.

The first metal layer 14a is within the first opening and surrounded by the passivation layer 10. The first metal layer 14a has a first surface 14a1 substantially parallel to the top surface 101 of the passivation layer 10, a second surface 14a2 adjacent to the first surface 14a1 and a third surface 14a3 adjacent to the first surface 14a1. In some embodiments, an angle $\theta_2$ defined by the first surface 14a1 and the second surface 14a2 is greater than about 90 degrees and less than about 180 degrees. For example, the angle $\theta_2$ defined by the first surface 14a1 and the second surface 14a2 can be an obtuse angle. The first surface 14a1, the second surface 14a2 and the third surface 14a3 define a recess facing toward the electrical contact 15. In some embodiments, the first metal layer 14a includes gold (Au), silver (Ag), nickel (Ni), copper (Cu), other metal(s) or alloy(s), or a combination of two or more thereof.

The barrier layer 14b is disposed on the first metal layer 14a and surrounded by the passivation layer 10. In some embodiments, the barrier layer 14b is conformal to the first metal layer 14a. Therefore, the barrier layer 14b is shaped as a recess facing toward the first metal layer 14a and/or accommodating at least a portion of the first metal layer 14a. In some embodiments, the barrier layer 14b includes titanium (Ti), Ni, palladium (Pd), other metal(s) or alloy(s), or a combination of two or more thereof.

The second metal layer 14c is disposed on the barrier layer 14b and surrounded by the passivation layer 10. In some embodiments, the second metal layer 14c is conformal to the barrier layer 14b. Therefore, the second metal layer 14c is shaped as a recess facing toward the barrier layer 14b and/or accommodating at least a portion of the barrier layer 14b. In some embodiments, the second metal layer 14c includes Cu, other metal(s) or alloy(s), or a combination thereof.

At least a portion of the electrical contact 15 is within the second opening of the passivation layer 10. As shown in FIG. 1B, at least a portion of the electrical contact 15 is disposed within the recess defined by the first surface 14a1, the second surface 14a2 and the third surface 14a3 of the first metal layer 14a. The electrical contact 15 electrically contacts one or more of the first surface 14a1, the second surface 14a2 and the third surface 14a3 of the first metal layer 14a. In some embodiments, the electrical contact 15 is a Controlled Collapse Chip Connection (C4) bump, a Ball Grid Array (BGA) or a Land Grid Array (LGA).

As mentioned above, the SMD type solder pad and the NSMD type solder pad has problems (e.g., missing ball, false soldering, or crack) that prevent them from being properly bonded with the solder ball. In accordance with the embodiments shown in FIGS. 1A and 1B, the solder pad (e.g., the solder pad including the first metal layer 14a, the barrier layer 14b and/or the second metal layer 14c) is formed as a clamp structure for accommodating the solder ball (e.g., the electrical contact 15). Therefore, the above problems can be solved, by increasing the bonding strength between the solder ball and the solder pad, which in turn enhances the electrical performance of the semiconductor package device 1.

In addition, since the first opening is tapered from the top surface 101 of the passivation layer 10 toward the bottom surface 102 of the passivation layer 10, the arrangement can prevent the interconnection structure 14 from being peeled off. Furthermore, since the second opening is tapered from the bottom surface 102 of the passivation layer 10 toward the top surface 101 of the passivation layer 10, the arrangement can prevent the electrical contact 15 from contacting the passivation layer 10 during a reflow process, and prevent formation of void in the electrical contact 15.

A seed layer 10s is disposed on the top surface 101 of the passivation layer 10 and the second metal layer 14c. The seed layer 10s extends within the first opening and contacts a portion of the sidewall 103 of the first opening. Therefore, the seed layer 10s has a turning angle $\theta_3$ less than about 90 degrees, less than about 100 degrees, or less than about 120 degrees. A portion of the seed layer 10s having the turning angle is also referred to as a rivet structure (e.g., rivet structure 10rv as shown in FIG. 1B). The turning angle of the seed layer 10s can increase the bonding strength between the interconnection structure 14 and the seed layer 10s and/or a conductive layer 10r.

The conductive layer 10r is disposed on the seed layer 10s. For example, the conductive layer 10r is disposed over the top surface 101 of the passivation layer 10 and extends within the first opening. In some embodiments, the conductive layer 10r includes Cu, Ag, Au, platinum (Pt), aluminum (Al), a solder alloy, or a combination of two or more thereof.

The dielectric layer 11 is disposed on at least a portion of the top surface 101 of the passivation layer 10 and covers at least a portion of the top surface 101 of the passivation layer 10, the seed layer 10s and a portion of the conductive layer 10r. The dielectric layer 11 defines an opening to expose a portion of the conductive layer 10r. In some embodiments, the number of dielectric layers and conductive layers can vary according to several different embodiments. In some embodiments, the dielectric layer 11 may include organic material, solder mask, polyimide (PI), epoxy, Ajinomoto build-up film (ABF), molding compound, or a combination of two or more thereof.

A seed layer 11s is disposed on the dielectric layer 11 and extends within the opening of the dielectric layer 11 to electrically contact an exposed portion of the conductive layer 10r. A conductive layer 11r is disposed on the seed layer 11s. For example, the conductive layer 11r is disposed over the dielectric layer 11 and extends within the opening of the dielectric layer 11. In some embodiments, the conductive layer 11r includes Cu, Ag, Au, Pt, Al, a solder alloy, or a combination of two or more thereof.

The seed layer 10s, the conductive layer 10r, the seed layer 11s, and the conductive layer 11r may be collectively referred to as a redistribution layer (RDL). Alternatively, any portion of the combination of the seed layer 10s, the conductive layer 10r, the seed layer 11s, and the conductive layer 11r may be referred to as the RDL.

Referring back to FIG. 1A, the electronic component 12 is disposed on the dielectric layer 11 and electrically connected to the conductive layer 11r through a conductive contact 16. The electronic component 12 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination of two or more thereof.

Figure 1D:
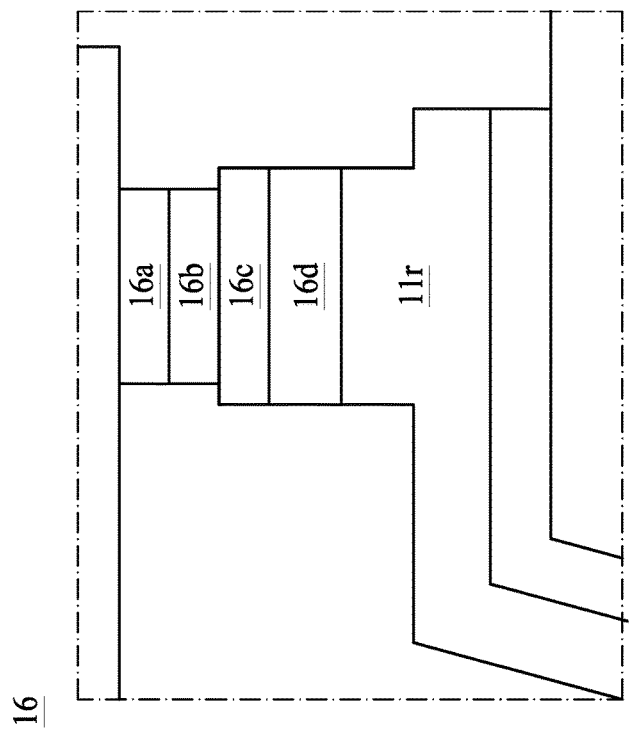
FIG. 1D illustrates an enlarged view of a portion of the semiconductor package device of FIG. 1A in accordance with some embodiments of the present disclosure.
Figure 1C:
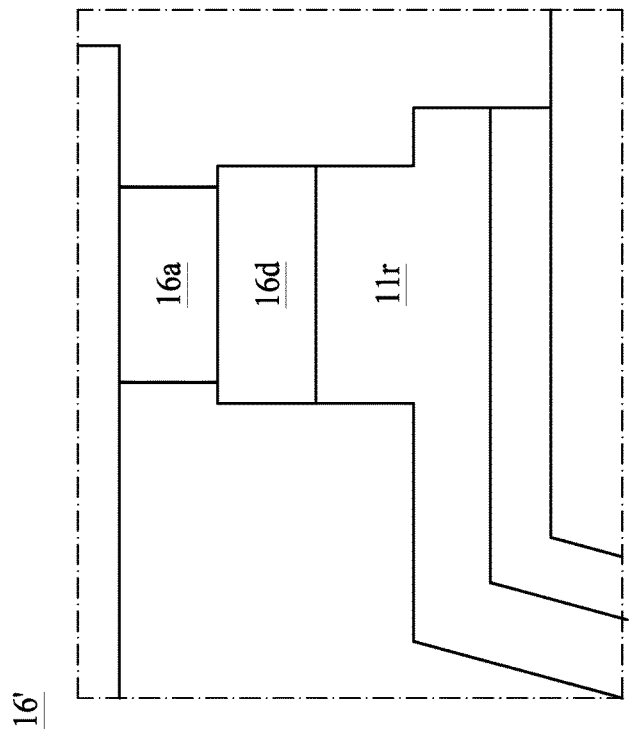
FIG. 1C illustrates an enlarged view of a portion of the semiconductor package device of FIG. 1A in accordance with some embodiments of the present disclosure.

FIG. 1C illustrates an enlarged view of the conductive contact 16 as shown in FIG. 1A, in accordance with some embodiments of the present disclosure. The conductive contract 16 includes a micro-bump 16a (e.g., Cu), a soldering connection layer 16b, a surface pad 16c (e.g., Au, Cu, or a combination thereof) and a solder layer 16d.

FIG. 1D illustrates an enlarged view of the conductive contact 16' as shown in FIG. 1A, in accordance with some embodiments of the present disclosure. The conductive contact 16' is similar to the conductive contact 16 shown in FIG. 1C, except that the conductive contact 16' does not include the soldering connection layer 16b and the surface pad 16c. The micro-bump 16a (e.g., Cu) is connected to the conductive layer 11r through the solder layer 16d.

Referring back to FIG. 1A, an underfill 12u may be disposed on the dielectric layer 11 to cover an active surface (also referred to as active side) of the electronic component 12 and the conductive contact 16. In some embodiments, the underfill 12u includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 12u may be a capillary underfill (CUF), a molded underfill (MUF) or a dispensing gel, depending on specifications of different embodiments.

The package body 13 is disposed on the dielectric layer 11 and covers the electronic component 12 and the underfill 12u. In some embodiments, the package body 13 covers a back surface (also referred to as backside) of the electronic component 12. Alternatively, as shown in FIG. 1A, the package body 13 exposes the back surface of the electronic component 12. In some embodiments, the package body 13 includes, for example, one or more organic materials (e.g., molding compound, bismaleimide triazine (BT), PI, polybenzoxazole (PBO), solder resist, ABF, polypropylene (PP), epoxy-based material, or a combination of two or more thereof), inorganic materials (e.g., silicon, glass, ceramic, quartz, or a combination of two or more thereof), liquid, dry-film material(s), or a combination of two or more thereof.

Figure 2A:
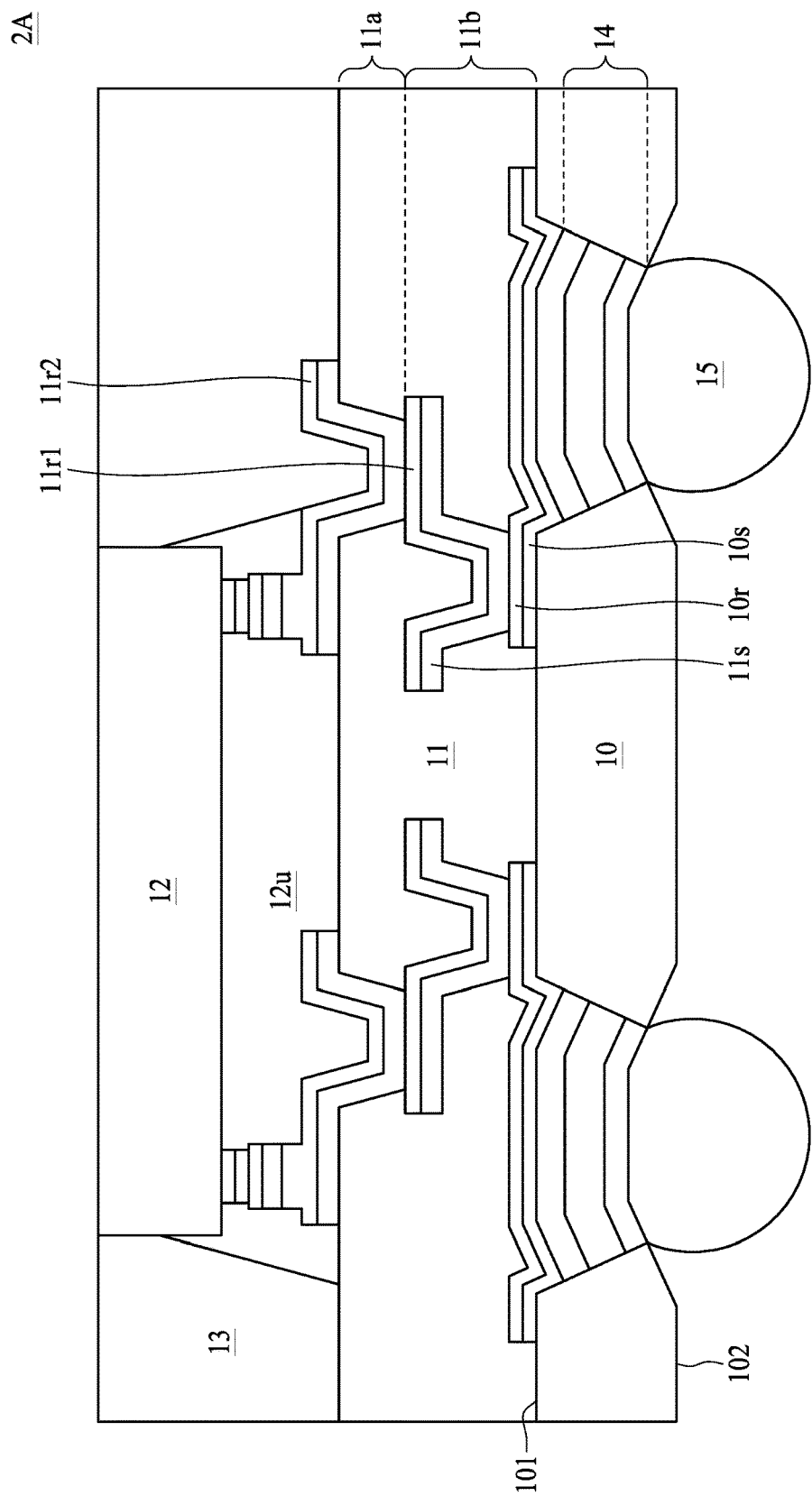
FIG. 2A illustrates a cross-sectional view of a semiconductor package device in accordance with some embodiments of the present disclosure.
Figure 2B:
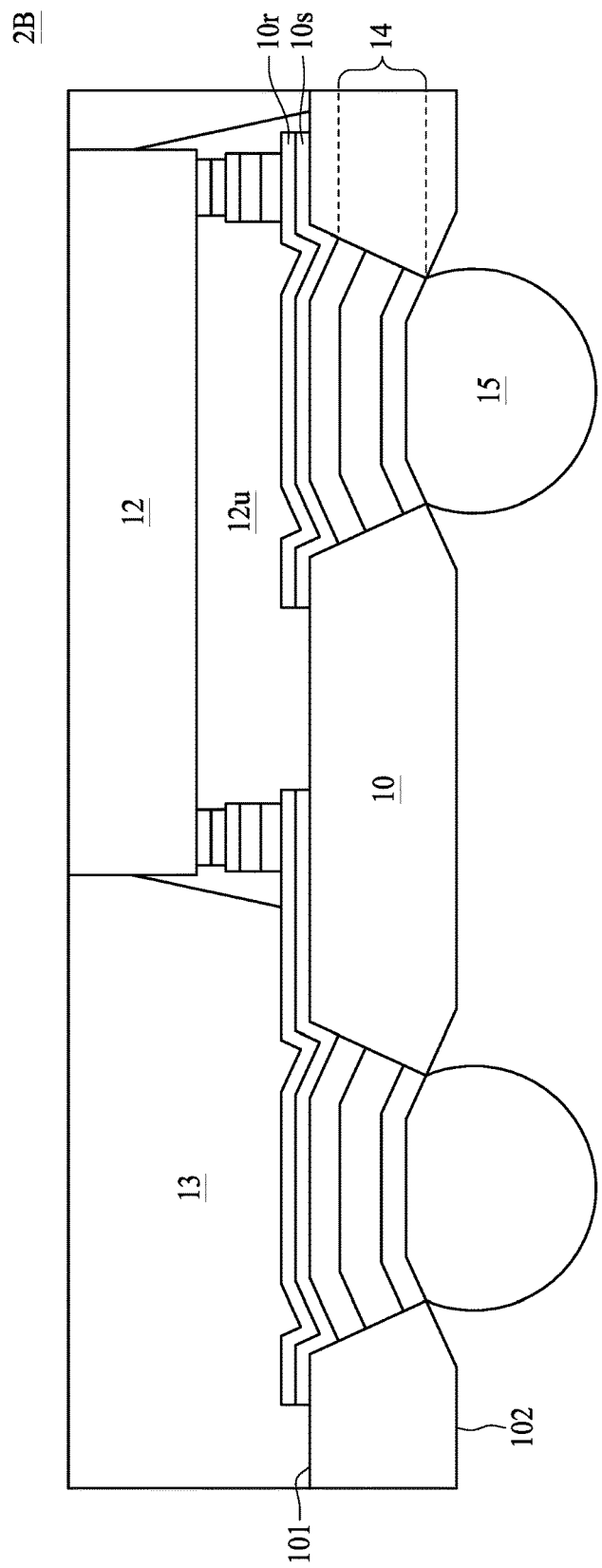
FIG. 2B illustrates a cross-sectional view of a semiconductor package device in accordance with some embodiments of the present disclosure.

FIG. 2A illustrates a semiconductor package device 2A in accordance with some embodiments of the present disclosure. The semiconductor package device 2A is similar to the semiconductor package device 1 shown in FIG. 1A, except that the semiconductor package device 2A includes multiple dielectric layers 11a, 11b and multiple conductive layers 11r. In some embodiments, the semiconductor package device may include any number of the dielectric layers and conductive layers depending on design specifications of various embodiments. In some embodiments, a dielectric layer can be eliminated as shown in the semiconductor package device 2B of FIG. 2B. In the semiconductor package device 2B, the seed layer 10s and the conductive layer 10r may be collectively referred to as an RDL.

FIGS. 3A, 3B, 3C, 3D, 3E, 3F, 3G, 3H, and 3I are cross-sectional views of a semiconductor structure fabricated at various stages, in accordance with some embodiments of the present disclosure. Various figures have been simplified for a better understanding of the aspects of the present disclosure.

Referring to FIG. 3A, a metal plate 39 is provided. In some embodiments, the metal plate 39 is formed of, e.g., Cu or other metals or alloys. In some embodiments, a thickness of the metal plate 39 is about 100 micrometer (μm) to 200 μm, about 50 μm to about 400 μm, or about 10 μm to about 1000 μm.

A photoresist film 37 (or mask) is attached to a top surface 391 of the metal plate 39. One or more openings 37b are formed on the photoresist film 37 by, for example, lithographic technique, to expose a portion of the top surface 391 of the metal plate 39. In some embodiments, a void 37a is formed between the photoresist film 37 and the top surface 391 of the metal plate 39.

Figure 3B:
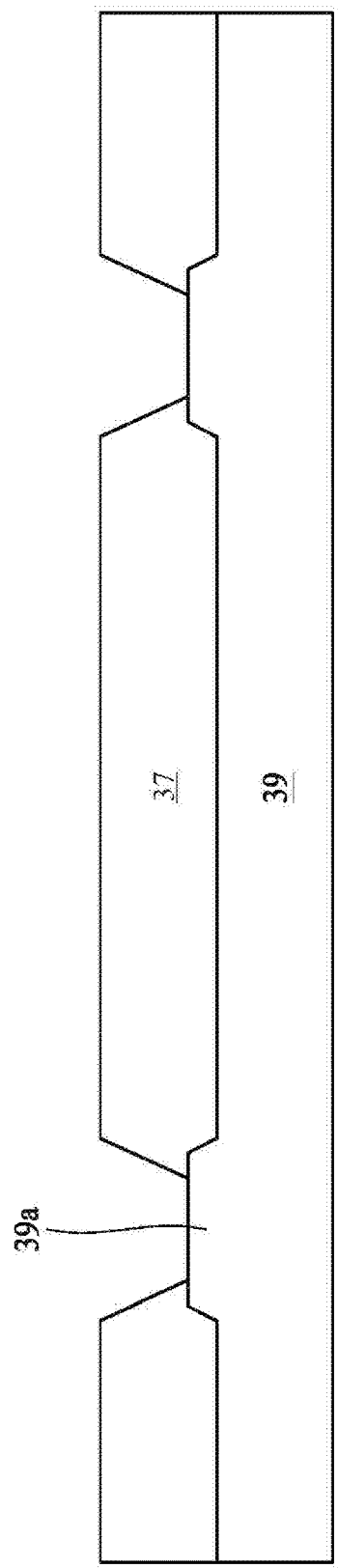
FIG. 3B illustrates one or more stages of a method of manufacturing a semiconductor package device in accordance with some embodiments of the present disclosure.

Referring to FIG. 3B, a metal layer 39a is formed on the exposed portion of the top surface 391 of the metal plate 39 and extends into the void 37a. In some embodiments, the metal layer 39a is formed by, e.g., electroplating or other suitable processes.

Figure 3C:
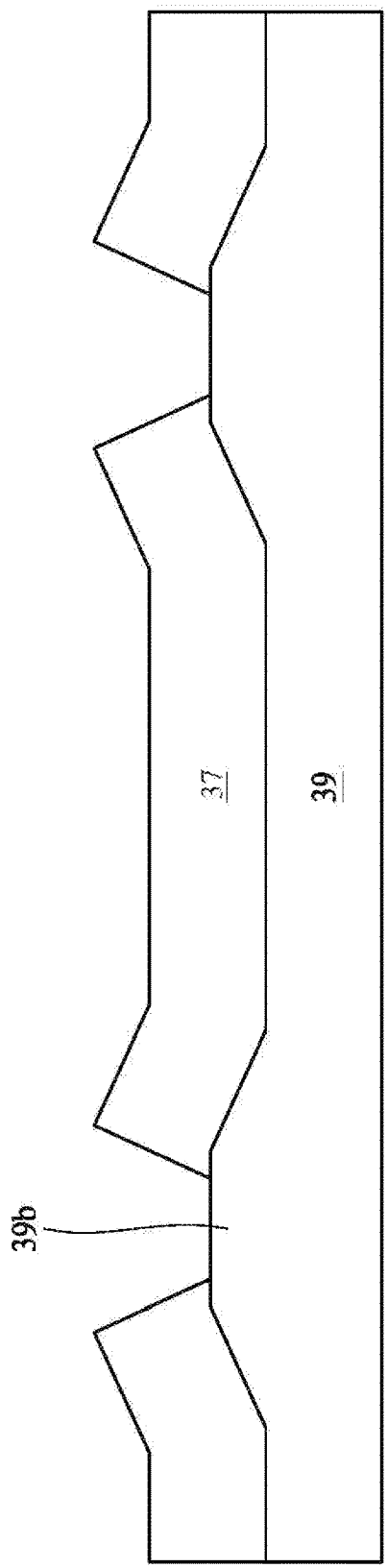
FIG. 3C illustrates one or more stages of a method of manufacturing a semiconductor package device in accordance with some embodiments of the present disclosure.

Referring to FIG. 3C, as the electroplating time increases, the edge of the photoresist film 37 would be raised by the metal layer 39a due to an increased volume of the metal layer 39a occupying the void 37a. Therefore, a metal bump 39b is formed on the exposed portion of the top surface 391 of the metal plate 39 as shown in FIG. 3C.

Figure 3D:
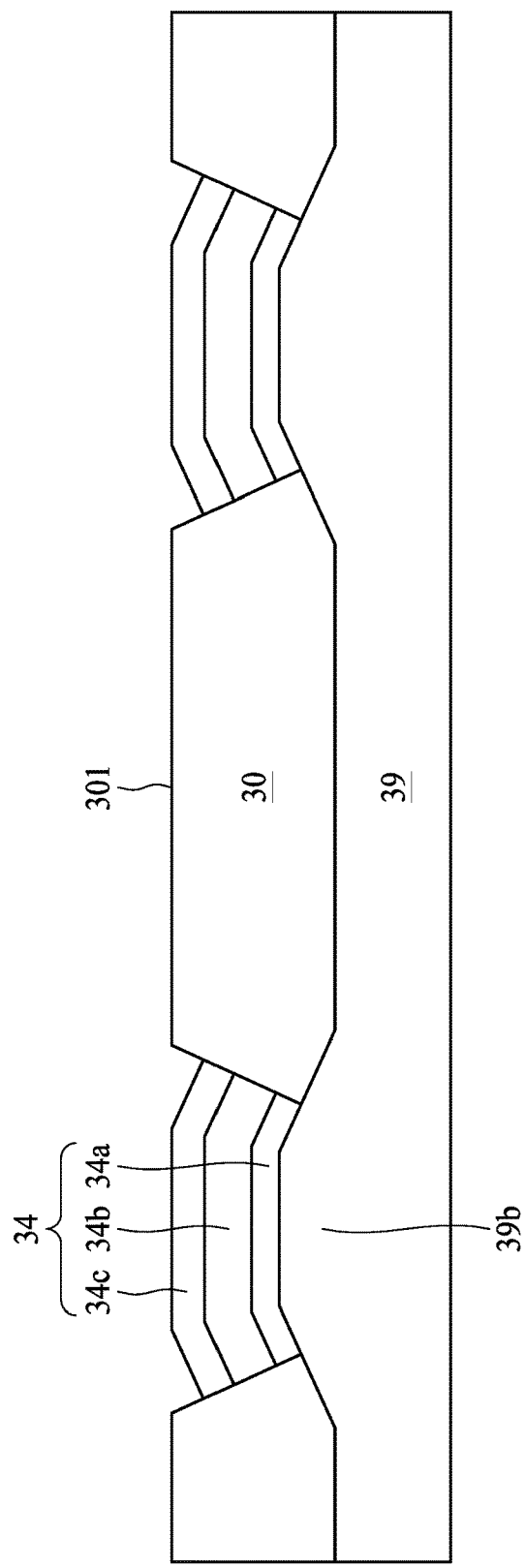
FIG. 3D illustrates one or more stages of a method of manufacturing a semiconductor package device in accordance with some embodiments of the present disclosure.

Referring to FIG. 3D, the photoresist film 37 is removed and a passivation layer 30 is formed on the top surface 391 of the metal plate 39 and on the metal bump 39b. One or more openings are formed to penetrate the passivation layer 30 and to expose the metal bump 39b. The opening is tapered from a top surface 301 of the passivation layer 30 into the passivation layer 30.

The interconnection structure 34 is then formed within the opening and on the metal bump 39b. In some embodiments, the interconnection structure 34 can be formed by forming a first metal layer 34a, a barrier layer 34b and a second metal layer 34c within the opening in sequence. In some embodiments, the first metal layer 34a, the barrier layer 34b and/or the second metal layer 34c can be formed by, e.g., electroplating, electroless-plating, sputtering, pasting printing, or other suitable processes.

Figure 3E:
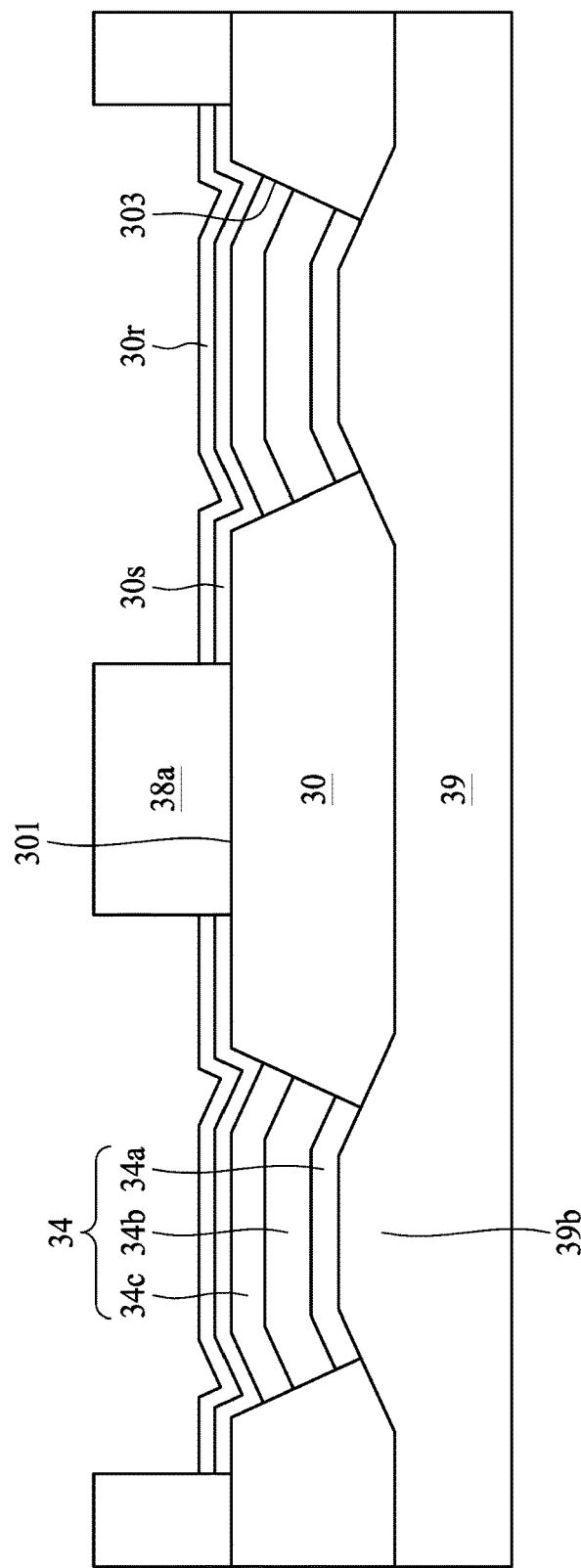
FIG. 3E illustrates one or more stages of a method of manufacturing a semiconductor package device in accordance with some embodiments of the present disclosure.

Referring to FIG. 3E, a photoresist layer 38a is placed on the top surface 301 of the passivation layer 30. The photoresist layer 38a defines one or more openings to expose a portion of the top surface 301 of the passivation layer 30 and the second metal layer 34c. A seed layer 30s is formed on the exposed portion of the top surface 301 of the passivation layer 30 and the second metal layer 34c. The seed layer 30s extends within the opening and contacts a portion of the sidewall 303 of the opening. In some embodiments, the seed layer 30s can be formed by, e.g., sputtering metal (e.g., Ti or Cu). A conductive layer 30r is then formed on the seed layer 30s by, e.g., electroplating metal (e.g., Cu).

Figure 3F:
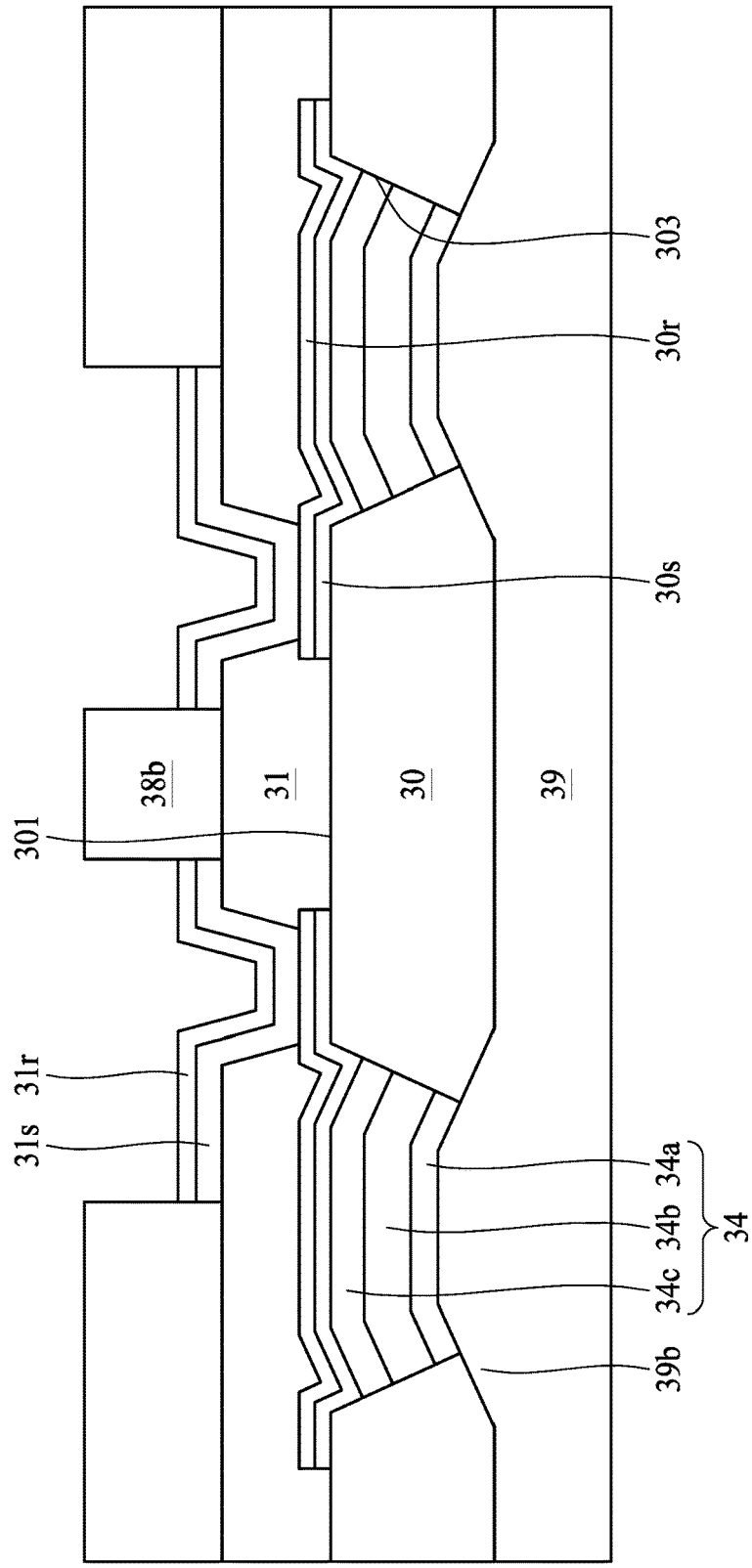
FIG. 3F illustrates one or more stages of a method of manufacturing a semiconductor package device in accordance with some embodiments of the present disclosure.

Referring to FIG. 3F, the photoresist layer 38a is removed and a dielectric layer 31 is formed on the conductive layer 30r. One or more openings are formed to penetrate the dielectric layer 31 to expose a portion of the conductive layer 30r. In some embodiments, the openings may be formed by, e.g., routing, etching, drilling or other suitable processes.

Figure 3G:
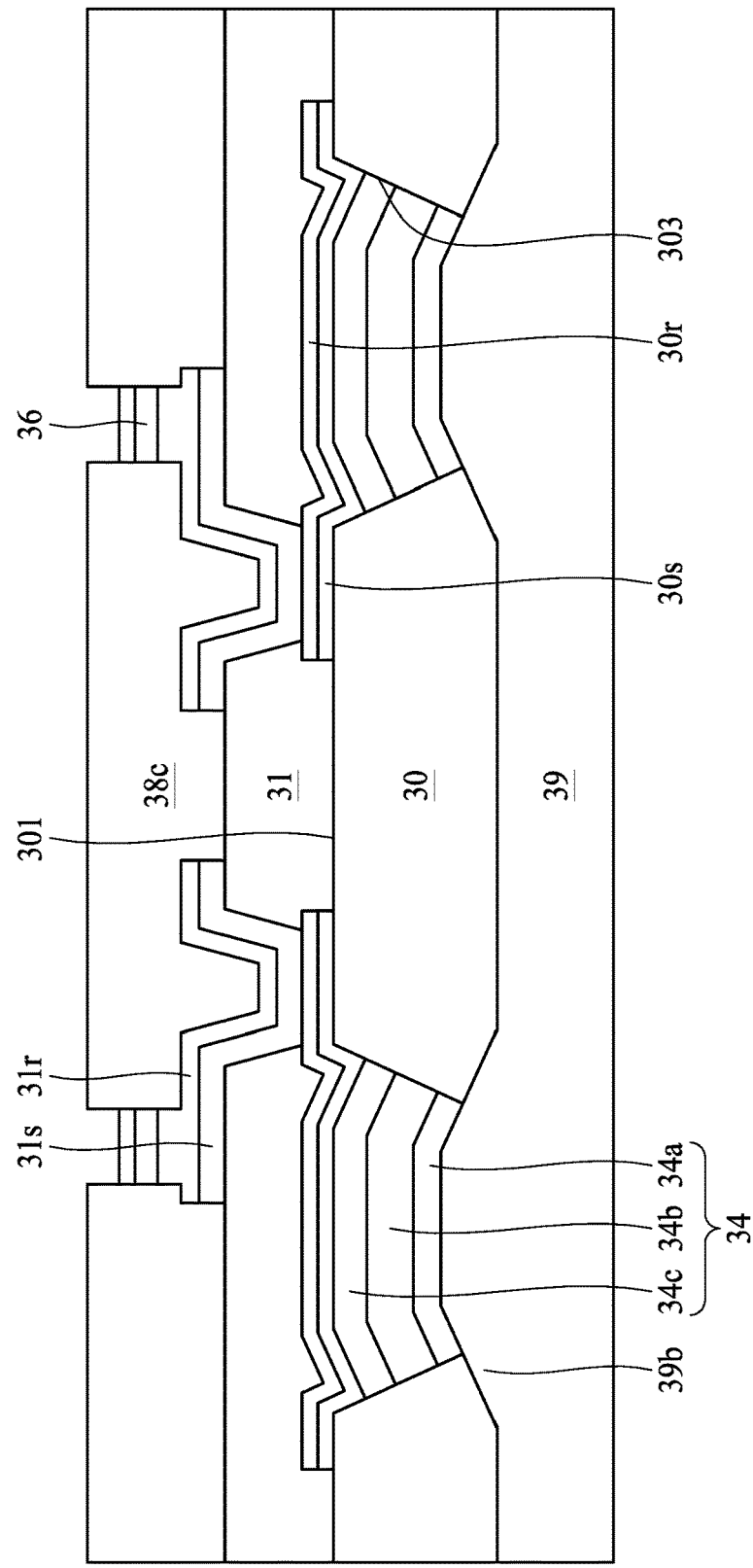
FIG. 3G illustrates one or more stages of a method of manufacturing a semiconductor package device in accordance with some embodiments of the present disclosure.

A photoresist layer 38b is placed on the dielectric layer 31. The photoresist layer 38b defines one or more openings to expose a portion of the dielectric layer 31 and a portion of the conductive layer 30r. A seed layer 31s is formed on the exposed portion of the dielectric layer 31 and extends within the opening of the dielectric layer 31 to contact the exposed portion of the conductive layer 30r. In some embodiments, the seed layer 31s can be formed by, e.g., sputtering metal (e.g., Ti or Cu). A conductive layer 31r is formed on the seed layer 31s by, e.g., electroplating metal (e.g., Cu). In some embodiments, the photoresist layer 38b is removed and another photoresist layer 38c is formed, as shown in FIG. 3G. In some alternative embodiments, additional photoresist materials are deposited on the photoresist layer 38b to form the photoresist layer 38c, as shown in FIG. 3G.

Referring to FIG. 3G, the photoresist layer 38c is placed on the dielectric layer 31. The photoresist layer 38c defines one or more openings to expose a portion of the conductive layer 31r. A conductive contact 36 is formed within each opening to electrically contact the exposed portion of the conductive layer 31r. In some embodiments, the conductive contact 36 is substantially the same as or similar to the conductive contact 16 shown in FIG. 1C. Alternatively, the conductive contact 36 is substantially the same as or similar to the conductive contact 16' shown in FIG. 1D. In some embodiments, the conductive contact 36 is formed by, e.g., electroplating metal (e.g., Cu, Ni, Au, or a combination of two or more thereof).

Figure 3H:
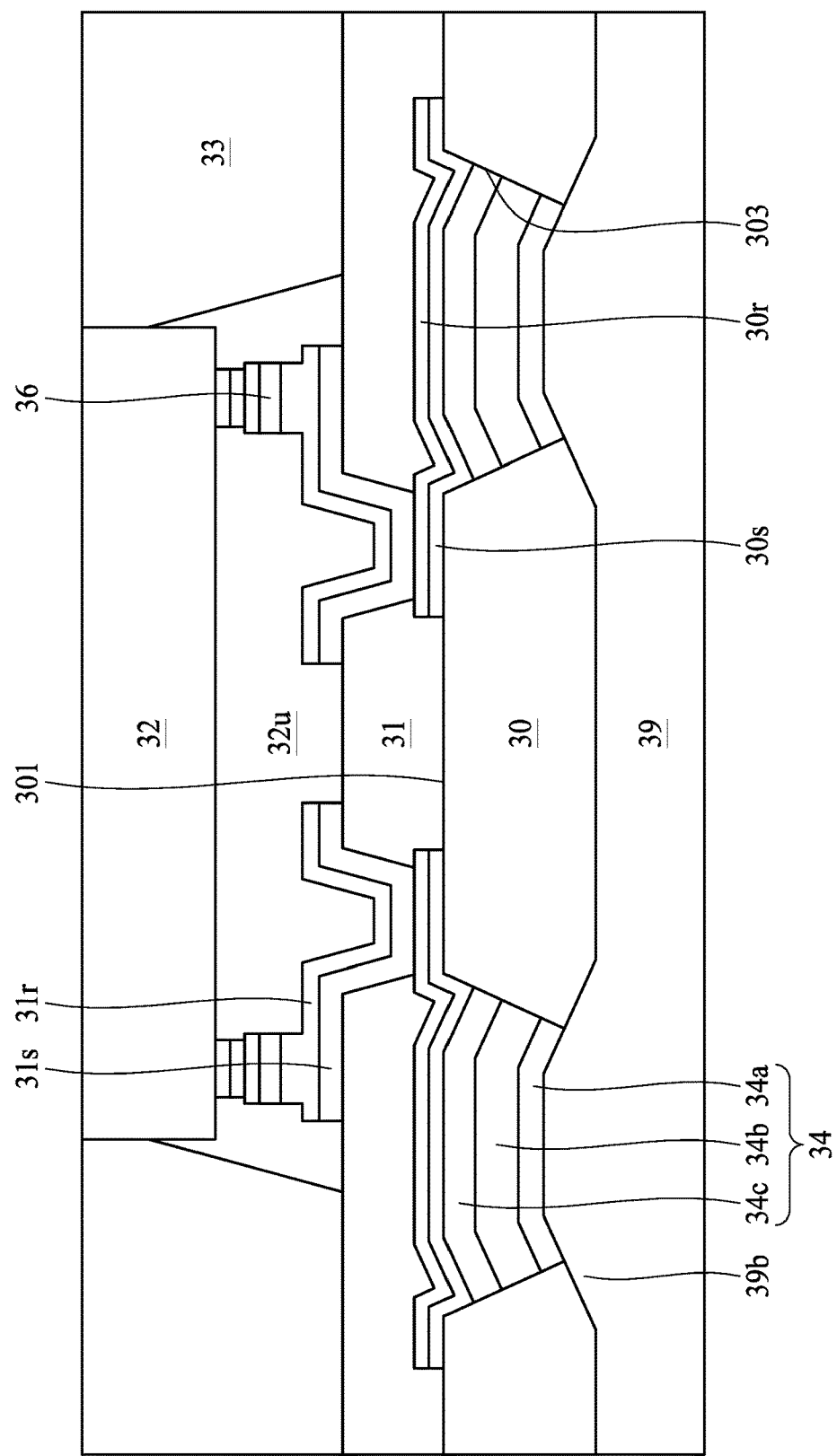
FIG. 3H illustrates one or more stages of a method of manufacturing a semiconductor package device in accordance with some embodiments of the present disclosure.

Referring to FIG. 3H, the photoresist layer 38c is removed and an electronic component 32 is placed on the conductive contact 36 to be electrically connected to the conductive contact 36.

An underfill 32u may be disposed or formed on the dielectric layer 31 to cover an active surface of the electronic component 32 and the electrical contact 36. In some embodiments, the underfill 32u includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 32u may be CUF, MUF or dispensing gel, depending on various specifications of different embodiments.

A package body 33 is formed on the dielectric layer 31 and covers at least a portion of a surface area of the electronic component 32 and the underfill 32u. In some embodiments, the package body 32 includes, for example, organic materials (e.g., molding compound, BT, PI, PBO, solder resist, ABF, PP, epoxy-based material, or a combination of two or more thereof), inorganic materials (e.g., silicon, glass, ceramic, quartz, or combination of two or more thereof), liquid, dry-film materials, or a combination of two or more thereof. The package body 32 may be formed by a molding technique, such as transfer molding or compression molding.

Figure 3I:
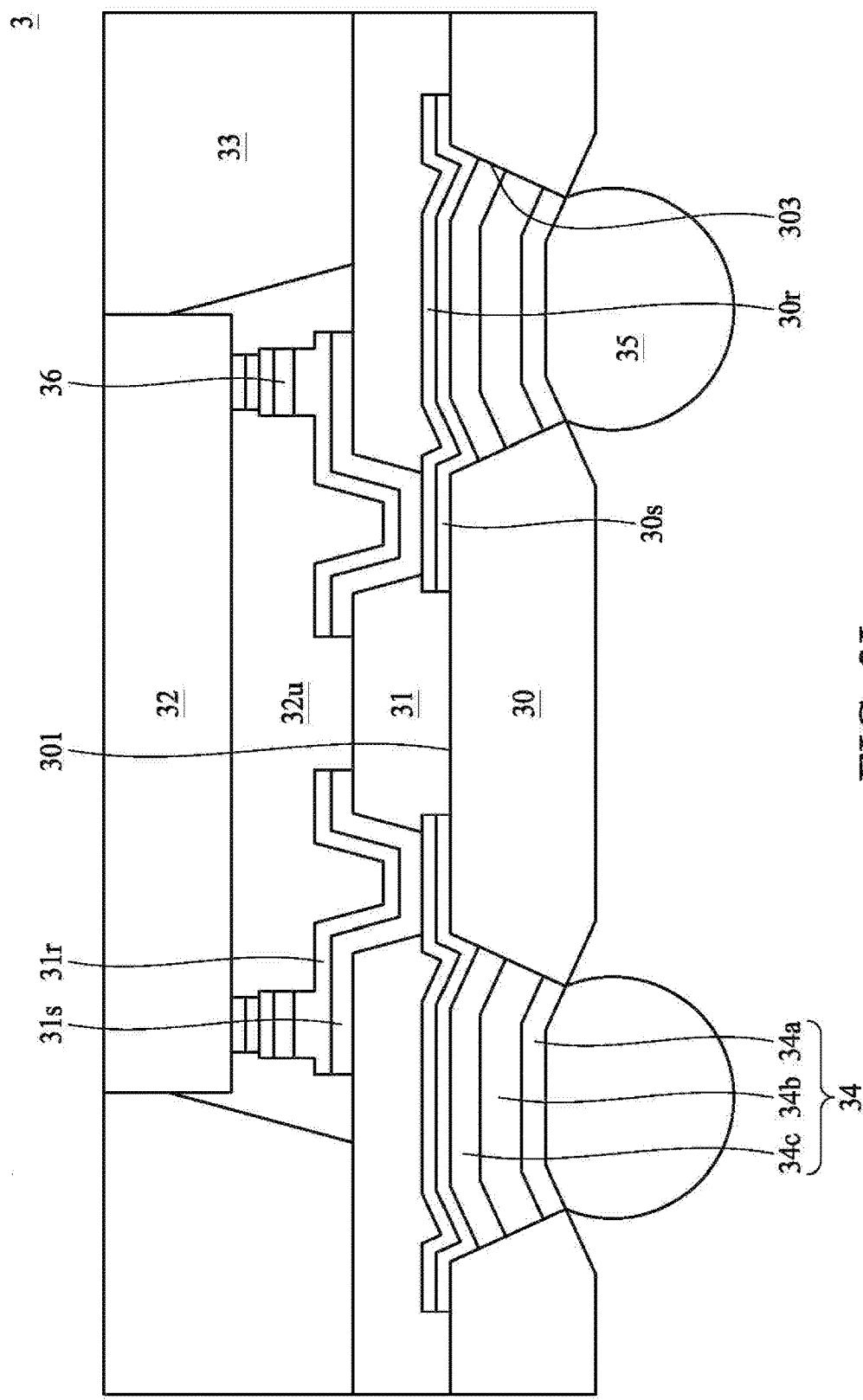
FIG. 3I illustrates one or more stages of a method of manufacturing a semiconductor package device in accordance with some embodiments of the present disclosure.

Referring to FIG. 3I, the metal layer 39 is removed to form one or more recesses to expose the first metal layer 34a. In some embodiments, the metal layer 39 can be removed by, e.g., etching, plasma, peeling or shearing.

Electrical contacts 35 (e.g., bumps or solder balls) are formed on the first metal layer 34a to form the semiconductor package device 3. In some embodiments, the electrical contacts 35 are C4 bumps, BGA or LGA. In some embodiments, the electrical contacts 35 can be formed by, e.g., electroplating, electroless plating, sputtering, paste printing, bumping or bonding process. In some embodiments, the semiconductor package device 3 shown in FIG. 3I is substantially the same as or similar to the semiconductor package device 1 shown in FIG. 1A.

Figure 4B:
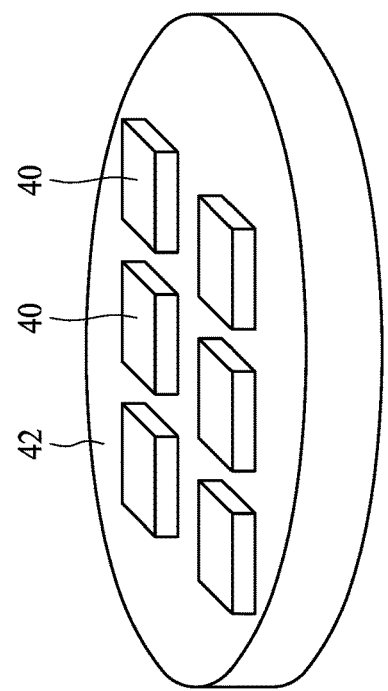
FIG. 4B illustrates various types of semiconductor package devices in accordance with some embodiments of the present disclosure.
Figure 4A:
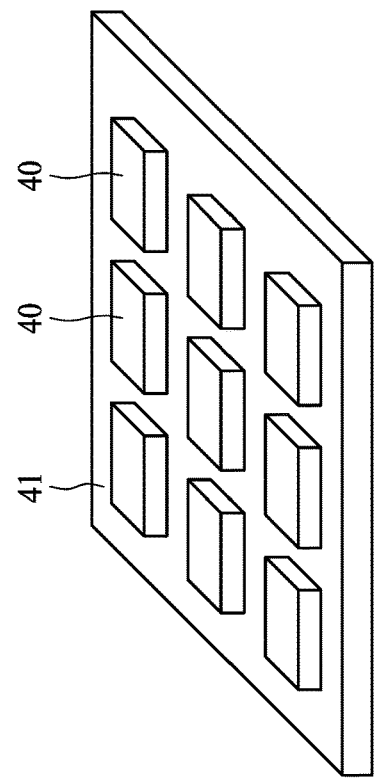
FIG. 4A illustrates various types of semiconductor package devices in accordance with some embodiments of the present disclosure.

FIGS. 4A and 4B illustrate different types of semiconductor package devices in accordance with some embodiments of the present disclosure.

As shown in FIG. 4A, a plurality of chips 40 and/or dies are placed on a square-shaped carrier 41. In some embodiments, the carrier 41 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As shown in FIG. 4B, a plurality of chips 40 and/or dies are placed on a circle-shaped carrier 42. In some embodiments, the carrier 42 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A conductive structure, comprising:
   a passivation layer;
   a conductive element surrounded by the passivation layer, the conductive element having a first surface and a second surface adjacent to the first surface, wherein an angle between the first surface and the second surface is greater than about 90 degrees, and wherein the passivation layer has a first surface and a second surface opposite to the first surface, the second surface of the passivation layer is adjacent to the first surface and the second surface of the conductive element, and wherein the first surface and the second surface of the conductive element are not protruded from the second surface of the passivation layer, wherein the passivation layer defines a first opening tapering from the first surface of the passivation layer toward the second surface of the passivation layer and a second opening tapering from the second surface of the passivation layer toward the first surface of the passivation layer, and the first opening and the second opening are connected to penetrate the passivation layer; and
   a conductive contact adjacent to the conductive element and electrically connected with the first surface and the second surface of the conductive element.

2. The conductive structure of claim 1, wherein the angle between the first surface of the conductive element and the second surface of the conductive element is less than about 180 degrees.

3. The conductive structure of claim 1, wherein at least a portion of the conductive element is within the first opening, and at least a portion of the conductive contact is within the second opening.

4. The conductive structure of claim 1, wherein a tilt angle of a sidewall of the first opening is different from a tilt angle of a sidewall of the second opening.

5. The conductive structure of claim 1, wherein an angle between the second surface of the passivation layer and a sidewall of the second opening is in a range from about 173 degrees to about 178 degrees.

6. The conductive structure of claim 1, further comprising a patterned conductive layer on the first surface of the passivation layer and extending along at least a portion of a sidewall of the first opening.

7. The conductive structure of claim 1, wherein the conductive element comprises a first metal layer, a barrier layer on the first metal layer and a second metal layer on the barrier layer.

8. The conductive structure of claim 1, wherein
   the conductive element comprises a third surface adjacent to the first surface; and
   the first surface, the second surface and the third surface of the conductive element define a recess facing the conductive contact.

9. The conductive structure of claim 1, further comprising a seed layer disposed on the first surface of the passivation layer, the seed layer extending within the first opening and contacting a sidewall of the first opening.

10. The conductive structure of claim 9, wherein the seed layer defines a turning angle of less than about 120 degrees.

11. The conductive structure of claim 1, wherein the first surface of the passivation layer faces toward the conductive contact, and the first surface and the second surface of the conductive element are recessed from the first surface of the passivation layer.

12. The conductive structure of claim 11, wherein the conductive element is not extended on the first surface of the passivation layer.

13. A semiconductor package device, comprising:
- a passivation layer having a first surface and a second surface opposite to the first surface;
- a conductive element within the passivation layer, wherein the conductive element defines a recess facing the second surface of the passivation layer, wherein the conductive element is not protruded from the second surface of the passivation layer;
- a redistribution layer (RDL) on the passivation layer and electrically connected with the conductive element; and
- an electronic component disposed on the RDL and electrically connected with the RDL, wherein the passivation layer defines a first opening tapering from the first surface of the passivation layer toward the second surface of the passivation layer and a second opening tapering from the second surface of the passivation layer toward the first surface of the passivation layer, and the first opening and the second opening are connected to penetrate the passivation layer.

14. The semiconductor package device of claim 13, further comprising a conductive contact, wherein at least a portion of the conductive contact is within the recess of the conductive element.

15. The semiconductor package device of claim 13, wherein at least a portion of the conductive element is within the first opening.

16. The semiconductor package device of claim 13, wherein a tilt angle of a sidewall of the first opening is different from a tilt angle of a sidewall of the second opening.

17. The semiconductor package device of claim 13, wherein the RDL has a rivet portion on a sidewall of the first opening.

18. The semiconductor package device of claim 13, wherein the conductive element comprises a first metal layer, a barrier layer on the first metal layer and a second metal layer on the barrier layer.

19. The semiconductor package device of claim 13, wherein
- the conductive element has a first surface substantially parallel to the first surface of the passivation layer, a second surface adjacent to the first surface and a third surface adjacent to the first surface, and
- the first surface, the second surface and the third surface of the conductive element define the recess.

20. The semiconductor package device of claim 19, wherein an angle between the first surface of the conductive element and the second surface of the conductive element is greater than about 90 degrees and less than about 180 degrees.

21. The semiconductor package device of claim 13, wherein the conductive element is not extended on the second surface of the passivation layer.

* * * * *